(12) United States Patent
Bacher et al.

(10) Patent No.: US 9,638,728 B2
(45) Date of Patent: May 2, 2017

(54) MEASUREMENT OF VARIATIONS OF A POWER SUPPLY VOLTAGE

(71) Applicant: STMicroelectronics (Rousset) SAS, Rousset (FR)

(72) Inventors: Yann Bacher, Rousset (FR); Nicolas Froidevaux, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/947,858

(22) Filed: Nov. 20, 2015

(65) Prior Publication Data

US 2016/0356828 A1    Dec. 8, 2016

(30) Foreign Application Priority Data

Jun. 8, 2015 (FR) ...................................... 15 55212

(51) Int. Cl.
*G01R 19/165* (2006.01)
*H02M 3/04* (2006.01)
*G01R 19/25* (2006.01)

(52) U.S. Cl.
CPC ... *G01R 19/16585* (2013.01); *G01R 19/2503* (2013.01); *H02M 3/04* (2013.01)

(58) Field of Classification Search
CPC ............................ G01R 19/16585; H02M 3/04
See application file for complete search history.

(56) References Cited

U.S. PATENT DOCUMENTS

| | | | | |
|---|---|---|---|---|
| 5,942,937 A * | 8/1999 | Bell | .......................... | H03K 5/08 327/270 |
| 7,023,190 B2 * | 4/2006 | Chapuis | ................ | H02M 3/157 323/282 |
| 7,642,943 B1 * | 1/2010 | Cetin | .................... | H03M 1/007 323/272 |
| 9,018,998 B2 * | 4/2015 | Sun | ........................ | H03K 5/131 327/270 |
| 2014/0184184 A1 | 7/2014 | Yajima et al. | | |

FOREIGN PATENT DOCUMENTS

| FR | 2 719 123 A1 | 10/1995 |
|---|---|---|
| FR | 2 783 636 A1 | 3/2000 |
| FR | 2 996 309 A1 | 4/2014 |

OTHER PUBLICATIONS

Chaiyuth Chansungsan, "Auto-Referenced On-Die Power Supply Noise Measurement Cicuit," Intel Corporation, IEEE 2005 Custom Integrated Circuits Conference, 4 pages.

(Continued)

*Primary Examiner* — Emily P Pham
(74) *Attorney, Agent, or Firm* — Seed IP Law Group LLP

(57) ABSTRACT

A circuit has a supply line, a reference line and circuitry coupled between the supply line and the reference line. The circuitry outputs a regulated voltage and a measurement voltage. An analog-to-digital converter (ADC) generates a digital signal indicative of variations of potential differences between the supply line and the reference line based on the regulated voltage and the measurement voltage. The generated digital signal may be used to control the circuit.

19 Claims, 3 Drawing Sheets

(56) References Cited

OTHER PUBLICATIONS

Dhia et al., "On-Chip Noise Sensor for Integrated Circuit Susceptibility Investigators," IEEE Transactions on Instrumentation and Measurement, vol. 61, No. 3, Mar. 2012, 12 pages.

Iorga et al., "A Built-in Technique for Measuring Substrate and Power-Supply Digital Switching Noise Using PMOS-Based Differential Sensors and a Waveform Sampler in System-on-Chip Applications," IEEE Transactions on Instrumentation and Measurement, vol. 56, No. 6, Dec. 2007, 8 pages.

Nieden et al., "Circuit Models for ESD-Generator-Cable Field Coupling Configurations Based on Measurement Data," Infineon Technologies AG, Munich, Germany, since May 2012, 6 pages.

* cited by examiner

MEASUREMENT OF VARIATIONS OF A POWER SUPPLY VOLTAGE

BACKGROUND

Technical Field

The present disclosure generally relates to electronic circuits and, more particularly, to a circuit for monitoring the power supply voltage of an integrated circuit.

Description of the Related Art

In many applications, the variation of the power supply voltage of an integrated circuit is desired to be monitored during its operation. Indeed, variations of this power supply voltage may induce problems in the circuit operation and/or reflect the circuit power consumption, and thus variations of the circuit activity and/or reflect behaviors of the circuit submitted to stress, for example, a disturbance which may be intentional (for example, an attack) or incidental (for example, an electrostatic discharge).

The power supply voltage is measured, for example, for test needs, by means of probes applied to different locations of the circuit and connected to a measurement device. The measurement is then particularly sensitive to electromagnetic disturbances generated by the use of conductive probes. Further, such a measurement is incompatible with a real time measurement during the operation of the circuit in its application environment.

Solutions internal to a circuit have already been provided to measure the variations of its power supply voltage. However, such solutions do not enable to measure non-periodic variations and the accuracy of the measurements depends on the actual value of the power supply voltage, the internal circuits being sensitive to disturbances of the power supply which is, most often, external to the circuit. Further, such measurements do not enable to measure voltages greater the voltage that can be withstood in the technology.

BRIEF SUMMARY

In an embodiment, a circuit comprises a supply line; a reference line; circuitry coupled between the supply line and the reference line, which, in operation, outputs a regulated voltage and a measurement voltage; and an analog-to-digital converter (ADC), which, in operation, generates a digital signal indicative of variations of potential differences between the supply line and the reference line based on the regulated voltage and the measurement voltage. In an embodiment, the circuit comprises delay circuitry coupled to the ADC, which, in operation, generates a delayed digital signal based on the generated digital signal. In an embodiment, the circuit comprises a memory, which, in operation, stores the generated digital signal. In an embodiment, the circuitry comprises a voltage regulator which, in operation, clips a voltage between the supply line and the reference line, generating the regulated voltage. In an embodiment, the circuitry comprises a voltage level shifter which, in operation, shifts a voltage between the supply line and the reference line, generating the measurement voltage. In an embodiment, the circuitry comprises: one or more first diodes coupled in series between the reference line and a first intermediate node; and one or more first resistors coupled in series between the first intermediate node and the supply line, wherein the circuitry, in operation, outputs the regulated voltage at the first intermediate node. In an embodiment, the circuitry comprises: one or more second diodes coupled in series between the supply line and a second intermediate node; and one or more second resistors coupled in series between the second intermediate node and the reference line, wherein the circuitry, in operation, outputs the measurement voltage at the second intermediate node. In an embodiment, a number of the one or more first diodes is less than or equal to a number of the one or more second diodes. In an embodiment, the ADC comprises: a regulated-voltage line coupled to the first intermediate node, which, in operation, receives the regulated voltage; a plurality of resistors coupled in series between the regulated-voltage line and the reference line; and a plurality of comparators each having: a first input coupled to the second intermediate node, which, in operation, receives the measurement voltage; and a second input coupled to a respective junction of a pair of resistors of the plurality of resistors, wherein, in operation, the plurality of comparators output bits of the digital signal. In an embodiment, the ADC comprises: a regulated-voltage line coupled to the circuitry, which, in operation, receives the regulated voltage; a plurality of resistors coupled in series between the regulated-voltage line and the reference line; and a plurality of comparators each having: a first input coupled to the circuitry, wherein the first input, in operation, receives the measurement voltage; and a second input coupled to a respective junction of a pair of resistors of the plurality of resistors, wherein, in operation, the plurality of comparators output bits of the digital signal. In an embodiment, the circuit comprises a controller, which, in operation, generates control signals based on the generated digital signal.

In an embodiment, a system comprises: a supply line; a reference line; voltage measurement circuitry, comprising: a voltage regulator coupled between the supply line and the reference line, which, in operation, outputs a regulated voltage; a voltage level shifter coupled between the supply line and the reference line, which, in operation, outputs a measurement voltage; and an analog-to-digital converter (ADC) coupled to the voltage regulator and the voltage level shifter, and which, in operation, generates a digital signal indicative of variations of voltages on the supply line based on the regulated voltage and the measurement voltage. In an embodiment, the system comprises delay circuitry coupled to the ADC, which, in operation, generates a delayed digital signal based on the generated digital signal. In an embodiment, the system comprises a memory, which, in operation, stores the generated digital signal. In an embodiment, the system comprises a controller, which, in operation, generates control signals based on the generated digital signal.

In an embodiment, a method comprises: receiving, by a circuit, a supply voltage; generating, by the circuit, a regulated voltage based on the supply voltage; generating, by the circuit, a measurement voltage based on the supply voltage; generating, by the circuit, a digital signal indicative of variations of the supply voltage based on the regulated voltage and the measurement voltage; and controlling the circuit based on the generated digital signal. In an embodiment, the method comprises: generating, by the circuit, a delayed digital signal based on the generated digital signal, wherein the controlling is based on the delayed digital signal. In an embodiment, the method comprises: storing, by the circuit, the generated digital signal, wherein the controlling is based on the stored digital signal. In an embodiment, generating the regulated voltage comprises clipping a voltage between a supply line and a reference line of the circuit. In an embodiment, generating the measurement voltage comprises shifting a level of a voltage between a supply line and a reference line of the circuit.

An embodiment facilitates addressing all or part of the disadvantages of usual circuits for measuring the power supply voltage of an integrated circuit.

In an embodiment, a measurement is taken inside of the circuit and by the circuit.

In an embodiment, a result of the measurement is stored.

An embodiment facilitates the measurement of non-periodic variations of the power supply voltage.

An embodiment provides a circuit to measure variations of a power supply voltage of an electronic circuit, comprising an analog-to-digital converter of a difference between a value based on the power supply voltage and a reference value.

In an embodiment, outputs of the analog-to-digital converter provide at least one first result.

According to an embodiment, the first signal is processed by at least one delay element having an output providing a second result.

According to an embodiment, the reference level corresponds to a clipped value of the power supply voltage.

DETAILED DESCRIPTION

Figure 1:
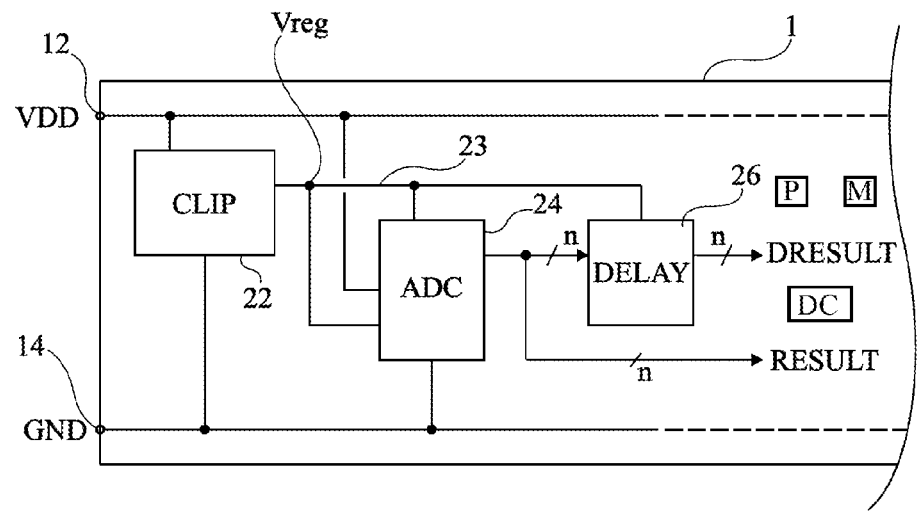
FIG. 1 schematically shows an embodiment of a circuit for measuring variations of the power supply voltage of an integrated circuit.

In the ensuing description, numerous specific details are provided in order to facilitate as much as possible understanding of the embodiments provided by way of example. The embodiments may be implemented with or without specific details, or else with other methods, components, materials, etc. In other cases, structures, materials, or operations that are well known are not shown or described in detail so that aspects of the embodiments will not be obscured. Reference in the framework of the present description to "an embodiment" or "one embodiment" means that a given peculiarity, structure, or characteristic described in connection with the embodiment is comprised in at least one embodiment. Hence, recurrence of phrases such as "in an embodiment" or "in one embodiment" in various points of the present description does not necessarily refer to one and the same embodiment. Moreover, the peculiarities, structures, or characteristics may be combined in any convenient way in one or more embodiments.

The notations and references are here provided only for convenience of the reader and do not define the scope or the meaning of the embodiments.

The same elements have been designated with the same reference numerals in the different drawings, unless the context indicates otherwise. In particular, the structural and/or functional elements common to the different embodiments may be designated with the same reference numerals and may have identical structural, dimensional, and material properties. For clarity, only those steps and elements which are useful to the understanding of the described embodiments have been shown and will be detailed. In particular, the elements present in the integrated circuit having its power supply voltage monitored have not been detailed, the described embodiments being compatible with usual applications. When reference is made to terms "about", "approximately", or "in the order of", this means to within 10%, and in some embodiments, to within 5%.

FIG. 1 schematically shows an embodiment of a circuit to measure variations of an electronic circuit power supply voltage.

Electronic circuit 1 is only partially shown with the elements forming the circuit of internal measurement of the variations of its power supply voltage. The rest of circuit 1 depends on the application.

Circuit 1 is supplied with a voltage VDD applied between a terminal or line 12 of application of a potential VDD and a terminal or line 14 defining a reference potential, typically ground GND. Voltage VDD is the power supply voltage having its variation desired to be measured.

According to an embodiment, a fast voltage limiter 22 (CLIP), that is, a limiter having a low time constant as compared with the duration of the variations to be measured, is provided. More specifically, since the applications targeted by the present description facilitate the detection of peaks in the power supply voltage, the limiter does not aim at smoothing voltage Vreg that is provides on output 23, but rather at limiting the excursion of the voltage that it provides, that is, at ascertaining that this voltage is clipped.

Voltage Vreg is used to power an analog-to-digital converter 24 (ADC) having a (conversion) input receiving a voltage based on the voltage VDD to be measured. Voltage Vreg is also used as a reference to generate the measurement voltages of converter 24. Converter 24 outputs a digital word RESULT over n bits representative of the instantaneous value of the measured voltage. This result may be directly interpreted.

In an embodiment, output bits RESULT are output to a delay circuit (DELAY) 26 (delay lines). The delay circuit delivers a signal DRESULT which enables to postpone the taking into account of the measurement by the rest of the circuit or by an external device. In the presence of a disturbance, there is a high risk for the circuit or the device reading the result to be itself disturbed. Postponing the taking into account of the measurement facilitates reducing this risk and providing a reliable measurement. Indeed, signal DRESULT contains the disturbance but this disturbance has disappeared when this signal is provided. Accordingly, the measurement interpretation circuit, be it internal or external, may determine the disturbance.

As illustrated, the circuit 1 comprises control circuitry, which includes processing circuitry P, one or more memories M and discrete circuitry DC. The processing circuitry P, the one or more memories M and the discrete circuitry DC of the control circuitry may perform, alone or in various combinations, one or more functions of the circuit 1, such as generating data and control signals, generating error signals (e.g., based on the signals RESULT and/or DRESULT), responding to error signals (e.g., generating signals to reset the circuit 1), etc.

Figure 2:
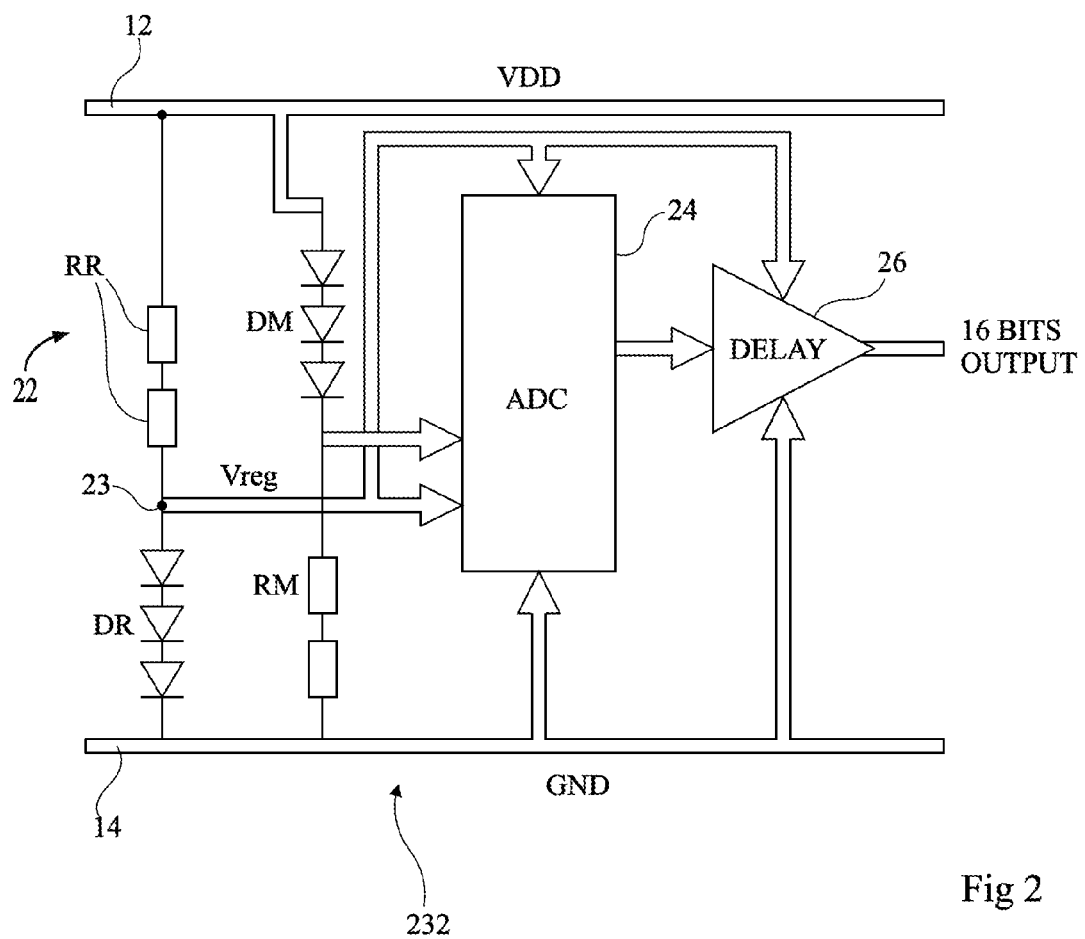
FIG. 2 illustrates a simplified embodiment of a clipper of the measurement circuit of FIG. 1.

FIG. 2 shows an embodiment of limiter 22 of FIG. 1 and a circuit 232 for adapting the measurement level of converter 24. In the example of FIG. 2, delay circuit 26 provides a digital signal over 16 bits (16 BITS OUTPUT).

Figure 3:
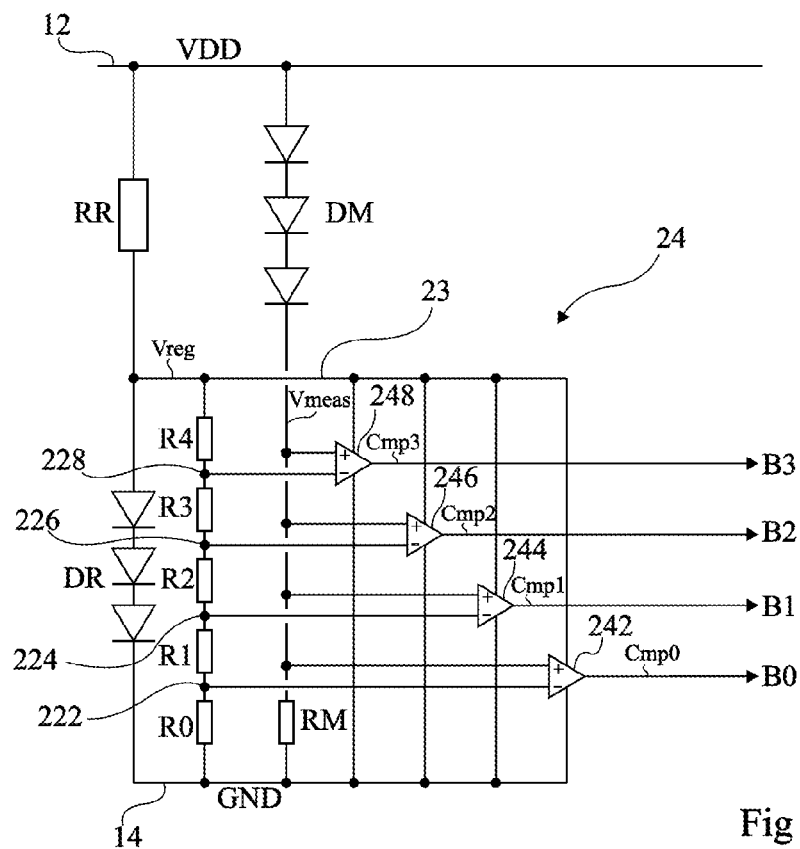
FIG. 3 is an embodiment of a converter fitting the measurement circuit of FIG. 1.

FIG. 3 shows a more detailed embodiment illustrating an embodiment of converter 24, associated with a voltage limiter and an impedance matching.

Regulator 22 is here formed of one or a plurality of resistors RR in series with one or a plurality of diodes (for example, three) DR, the diodes being oriented with their cathode towards terminal 14. Junction point 23 of resistors RR and diodes DR delivers clipped voltage Vreg. Voltage Vreg thus varies between the ground (at the circuit starting, the time for voltage VDD to increase) and a maximum level set by the sum of the forward voltage drops in diodes DR. In the example of FIG. 3, a single resistor RR is shown instead of two in FIG. 2.

On the side of converter 24, voltage Vreg is used as a measurement reference for the different weights of the converter bits. Thus, assuming, like in FIG. 3, a converter over 4 bits, four comparators 242 (Cmp0), 244 (Cmp1), 246 (Cmp2), and 248 (Cmp3) output the 4 states B0, B1, B2, B3 of the binary word. The reference inputs (for example, inverting) of comparators 242, 244, 246, and 248 are respectively connected to nodes 222, 224, 226, 228 of a series association of resistors R0, R1, R2, R3, R4, between terminal 23 and ground 14. The second inputs of comparators 242, 244, 246, and 248 (for example, non-inverting) receive an information Vmeas based on the voltage VDD. For example, these inputs are connected to the junction point of a set of diodes DM and of one or a plurality of resistors RM. In an embodiment, the number of diodes DR is smaller than or equal to the number of diodes DM. For example, the number of diodes DM corresponds to the number of diodes DR and the value of resistor RM (or the cumulated value of series-connected resistors RM) approximately corresponds to the value of resistor RR. Thus, the converter starts measuring variations of voltage VDD once it has reached at least value Vreg set by series-connected diodes DR.

Figure 4:
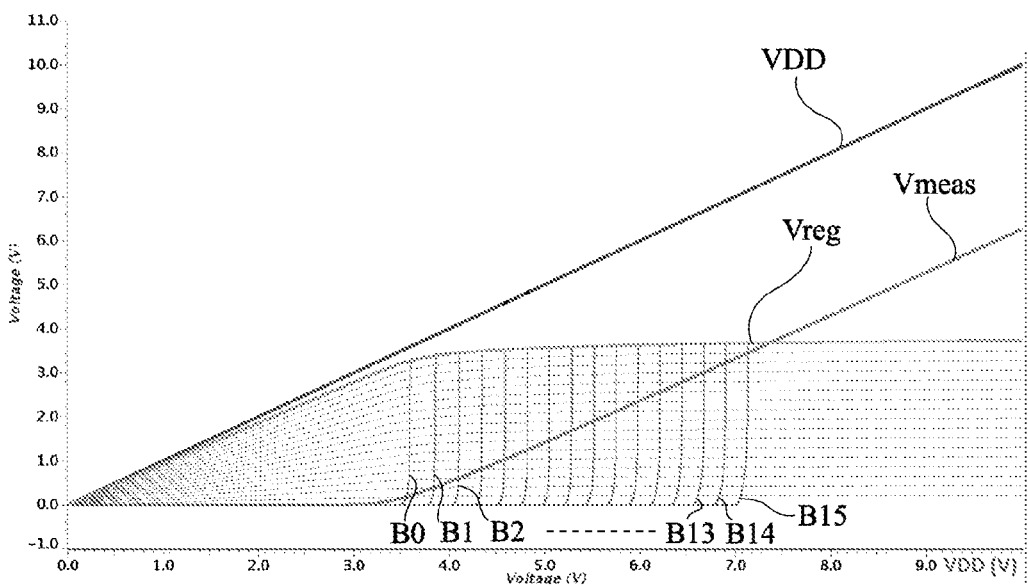
FIG. 4 is a graph showing an example of variation of voltage VDD and illustrating the static behavior of the circuit of FIG. 3.

FIG. 4 is a graph showing an example of variation of voltage VDD and illustrating the static behavior of the circuit of FIG. 3.

FIG. 4 illustrates, on voltage scales in volts (Voltage (V)), an example of growth of voltage VDD, from a zero value, the corresponding variation of voltage Vreg, of voltage Vmeas, and of binary outputs 0 to 15 (B0 to B15) of converter 24. In the example of FIG. 4, a converter 24 over 16 bits is assumed.

As long as voltage VDD has not reached value Vreg, all bits B0 to B15 are at state 0. When voltage VDD reaches level Vreg, bit B0 switches to state 1. Assuming, as in FIG. 4, a linear growth of voltage VDD, bits B1 to B15 switch one after the other until voltage Vmeas reaches (approximately) voltage Vreg.

Output RESULT of converter 24 thus delivers a binary value which is a function of voltage VDD. Output DRESULT delivers the same binary word, however delayed.

Figure 5:
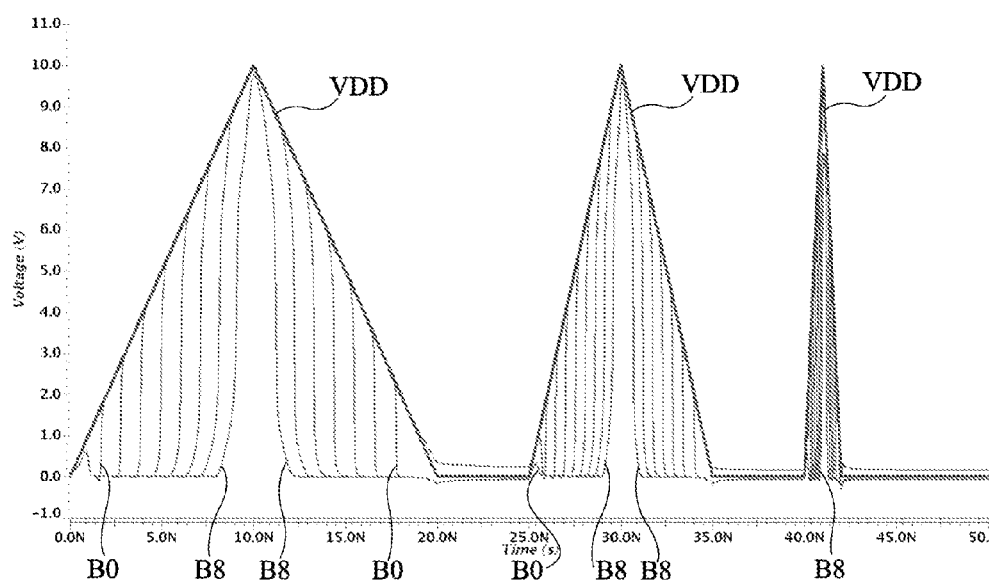
FIG. 5 is a timing diagram showing examples of variation of voltage VDD and illustrating the dynamic behavior of the circuit of FIG. 3.

FIG. 5 is a graph showing examples of variation of voltage VDD in volts (Voltage (V)) and illustrating the dynamic behavior of the circuit of FIG. 3.

FIG. 5 illustrates three examples of peaks of voltage VDD of variable speed as compared with voltage Vreg and the corresponding switchings of the bits of converter 24. In the example of FIG. 5, a converter 24 over 8 bits is assumed. Three peaks of same amplitude but of different durations on a time scale (Time (s)) in nanoseconds (N) are considered.

As illustrated in FIG. 5, the rapidity of the peaks is reflected by a switching of variable speed of the converter outputs. The faster the peak, the closer in time the switching of the outputs occurs. Similarly, the faster the peak, the faster the bits return to the quiescent state.

The fact of having a digital output (over a plurality of bits) facilitates storing the result of the measurement. The frequency of storage of the obtained values depends on the application and does not depend on the actual measurement.

An embodiment facilitates estimating the variations of the power supply voltage of an integrated circuit over time by reducing the impact of with possible electromagnetic disturbances. In an embodiment, a fast variation can be distinguished from a slow variation of the power supply voltage.

In an embodiment, the measurement is performed differentially with respect to voltage Vreg, and independent from the value of voltage VDD.

In an embodiment, the measurement circuitry is integrated to the actual circuit, which facilitates use in a wide range of available applications. For example, the measurement circuit may be used to detect possible attacks of an integrated circuit by modification of its power supply voltage or to detect an external disturbance of electrostatic discharge type. The integrated circuit may then take the necessary protective measurements. For example, the integrated circuit may be reset, error processing may be performed, etc.

Various embodiments have been described. Various alterations, modifications, and improvements will occur to those skilled in the art. In particular, the number of bits of the converter depends on the application and on the accuracy desired in the estimation of the voltage value. Further, the conversion speed may also be adapted according to the behavior which is desired to be measured. Further, the selection of the detection thresholds may also depend on the application. According to another variation, the circuit is capable of measuring negative voltage peaks. Finally, the practical implementation of the embodiments which have been described is within the abilities of those skilled in the art based on the functional indications given hereabove.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

Some embodiments may take the form of or include computer program products. For example, according to one embodiment there is provided a computer readable medium including a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some of the systems and/or modules and/or circuits and/or blocks may be implemented or provided in other manners, such as at least partially in firmware and/or hardware, including, but not limited to, one or more application-specific integrated circuits (ASICs), digital signal processors, discrete circuitry, logic gates, standard integrated circuits, state machines, look-up tables, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A circuit, comprising:
a supply line;
a reference line;
circuitry coupled between the supply line and the reference line, which, in operation, outputs a regulated voltage and a measurement voltage; and
an analog-to-digital converter (ADC), which, in operation, generates a digital signal indicative of variations of potential difference between the supply line and the reference line based on the regulated voltage and the measurement voltage, wherein the circuitry comprises:
one or more first diodes coupled in series between the reference line and a first intermediate node; and
one or more first resistors coupled in series between the first intermediate node and the supply line, wherein the circuitry, in operation, outputs the regulated voltage at the first intermediate node.

2. The circuit of claim 1, comprising delay circuitry coupled to the ADC, which, in operation, generates a delayed digital signal based on the generated digital signal.

3. The circuit of claim 1, comprising a memory, which, in operation, stores the generated digital signal.

4. The circuit of claim 1 wherein the circuitry comprises a voltage regulator which, in operation, clips a voltage between the supply line and the reference line, generating the regulated voltage.

5. The circuit of claim 1 wherein the circuitry comprises a voltage level shifter which, in operation, shifts a voltage between the supply line and the reference line, generating the measurement voltage.

6. The circuit of claim 1 wherein the circuitry comprises:
one or more second diodes coupled in series between the supply line and a second intermediate node; and
one or more second resistors coupled in series between the second intermediate node and the reference line, wherein the circuitry, in operation, outputs the measurement voltage at the second intermediate node.

7. The circuit of claim 6 wherein a number of the one or more first diodes is less than or equal to a number of the one or more second diodes.

8. The circuit of claim 6 wherein the ADC comprises:
a regulated-voltage line coupled to the first intermediate node, which, in operation, receives the regulated voltage;
a plurality of resistors coupled in series between the regulated-voltage line and the reference line; and
a plurality of comparators each having:
a first input coupled to the second intermediate node, which, in operation, receives the measurement voltage; and
a second input coupled to a respective junction of a pair of resistors of the plurality of resistors, wherein, in operation, the plurality of comparators output bits of the digital signal.

9. The circuit of claim 1 wherein the ADC comprises:
a regulated-voltage line coupled to the circuitry, which, in operation, receives the regulated voltage;
a plurality of resistors coupled in series between the regulated-voltage line and the reference line; and
a plurality of comparators each having:
a first input coupled to the circuitry, wherein the first input, in operation, receives the measurement voltage; and
a second input coupled to a respective junction of a pair of resistors of the plurality of resistors, wherein, in operation, the plurality of comparators output bits of the digital signal.

10. The circuit of claim 1, comprising a controller, which, in operation, generates control signals based on the generated digital signal.

11. A system, comprising:
a supply line;
a reference line;
voltage measurement circuitry, comprising:
a voltage regulator coupled between the supply line and the reference line, which, in operation, outputs a regulated voltage;
a voltage level shifter coupled between the supply line and the reference line, which, in operation, outputs a measurement voltage; and
an analog-to-digital converter (ADC) coupled to the voltage regulator and the voltage level shifter, and which, in operation, generates a digital signal indicative of variations of a voltage on the supply line based on the regulated voltage and the measurement voltage, wherein the voltage regulator comprises:
one or more first diodes coupled in series between the reference line and a first intermediate node; and
one or more first resistors coupled in series between the first intermediate node and the supply line, wherein the voltage regulator, in operation, outputs the regulated voltage at the first intermediate node.

12. The system of claim 11, comprising delay circuitry coupled to the ADC, which, in operation, generates a delayed digital signal based on the generated digital signal.

13. The system of claim 11, comprising a memory, which, in operation, stores the generated digital signal.

14. The system of claim 11, comprising a controller, which, in operation, generates control signals based on the generated digital signal.

15. A method, comprising:
receiving, by a circuit, a supply voltage;
generating, by the circuit, a regulated voltage based on the supply voltage;
generating, by the circuit, a measurement voltage based on the supply voltage;
generating, by the circuit, a digital signal indicative of variations of the supply voltage based on the regulated voltage and the measurement voltage; and
controlling the circuit based on the generated digital signal, wherein the circuit comprises:
one or more first diodes coupled in series between a reference line and a first intermediate node; and
one or more first resistors coupled in series between the first intermediate node and a supply line, wherein the circuit, in operation, outputs the regulated voltage at the first intermediate node.

16. The method of claim 15, comprising:
generating, by the circuit, a delayed digital signal based on the generated digital signal, wherein the controlling is based on the delayed digital signal.

17. The method of claim 15, comprising:
storing, by the circuit, the generated digital signal, wherein the controlling is based on the stored digital signal.

18. The method of claim 15 wherein generating the regulated voltage comprises clipping a voltage between a supply line and a reference line of the circuit.

19. The method of claim 15 wherein generating the measurement voltage comprises shifting a level of a voltage between a supply line and a reference line of the circuit.

* * * * *